United States Patent [19]

Rahn et al.

[11] Patent Number: 4,775,776

[45] Date of Patent: * Oct. 4, 1988

[54] MULTI STAGE HEATER

[75] Inventors: Armin Rahn, St. Jean-sur-Richelieu; Sabi Avramescu, Côte St. Luc; Marcel Drouin, St. Hubert, all of Canada

[73] Assignee: Electrovert Limited, Canada

[*] Notice: The portion of the term of this patent subsequent to Dec. 30, 2003 has been disclaimed.

[21] Appl. No.: 880,798

[22] Filed: Jul. 1, 1986

Related U.S. Application Data

[63] Continuation-in-part of Ser. No. 470,494, Feb. 28, 1983, Pat. No. 4,632,291.

[51] Int. Cl.[4] .............................................. F27B 9/06
[52] U.S. Cl. ...................................... 219/388; 228/9; 228/102; 236/15 BC; 432/53
[58] Field of Search ............ 219/388, 354, 358, 388 S, 219/483; 34/48, 216; 228/9, 37, 102, 232; 236/15 BC; 432/52, 53, 144, 148; 29/350

[56] References Cited

U.S. PATENT DOCUMENTS

| | | | |
|---|---|---|---|
| 4,245,613 | 1/1981 | Wells et al. | 219/388 X |
| 4,354,095 | 10/1982 | DeVries | 219/388 |
| 4,517,448 | 5/1985 | Crain et al. | 219/388 |
| 4,565,917 | 1/1986 | Furteck | 219/388 |
| 4,605,161 | 12/1986 | Motomiya et al. | 219/388 X |

FOREIGN PATENT DOCUMENTS

| | | | |
|---|---|---|---|
| 58-2912 | 1/1983 | Japan | 236/15 BC |
| 549419842 | 2/1984 | Japan | |

Primary Examiner—A. D. Pellinen
Assistant Examiner—H. L. Williams
Attorney, Agent, or Firm—Darby & Darby

[57] ABSTRACT

A multi stage heater heats items on a conveyor so that they follow a predetermined temperature profile. The heater is used for printed circuit boards or the like when heated for soldering and avoids thermal gradients that can occur with heating different materials. The heater has a first heater for applying a first quantity of heat to items on the conveyor, a temperature sensing device for determining temperature of items leaving the first heater, a second heater downstream of the first heater and a control system which compares signals from the temperature sensing device with a predetermined temperataure profile to produce a first control output to control the first heater and a second control output to control the second heater so that items passing through the heater follow the predetermined temperature profile.

48 Claims, 23 Drawing Sheets

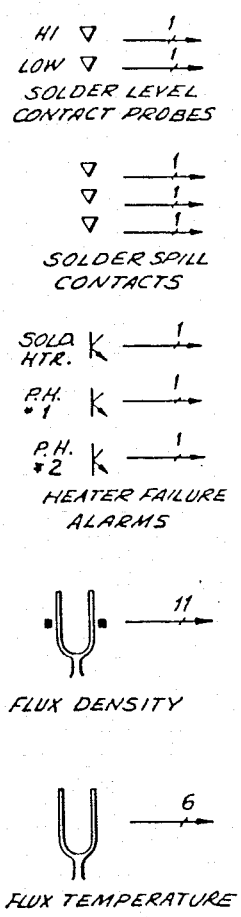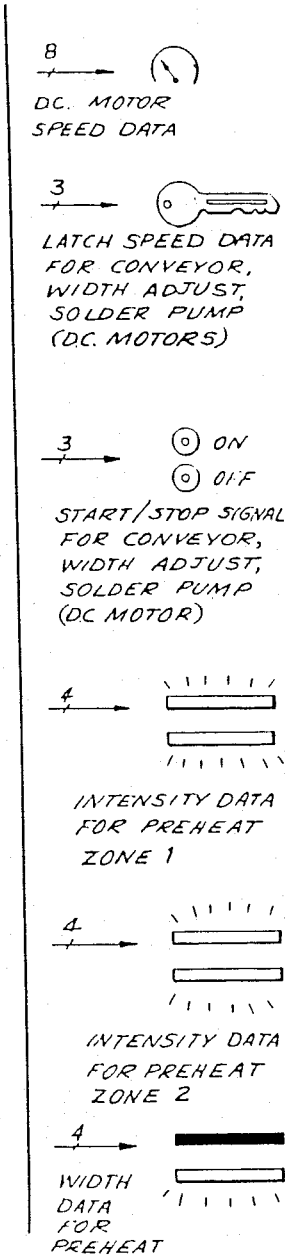
FIG.6B

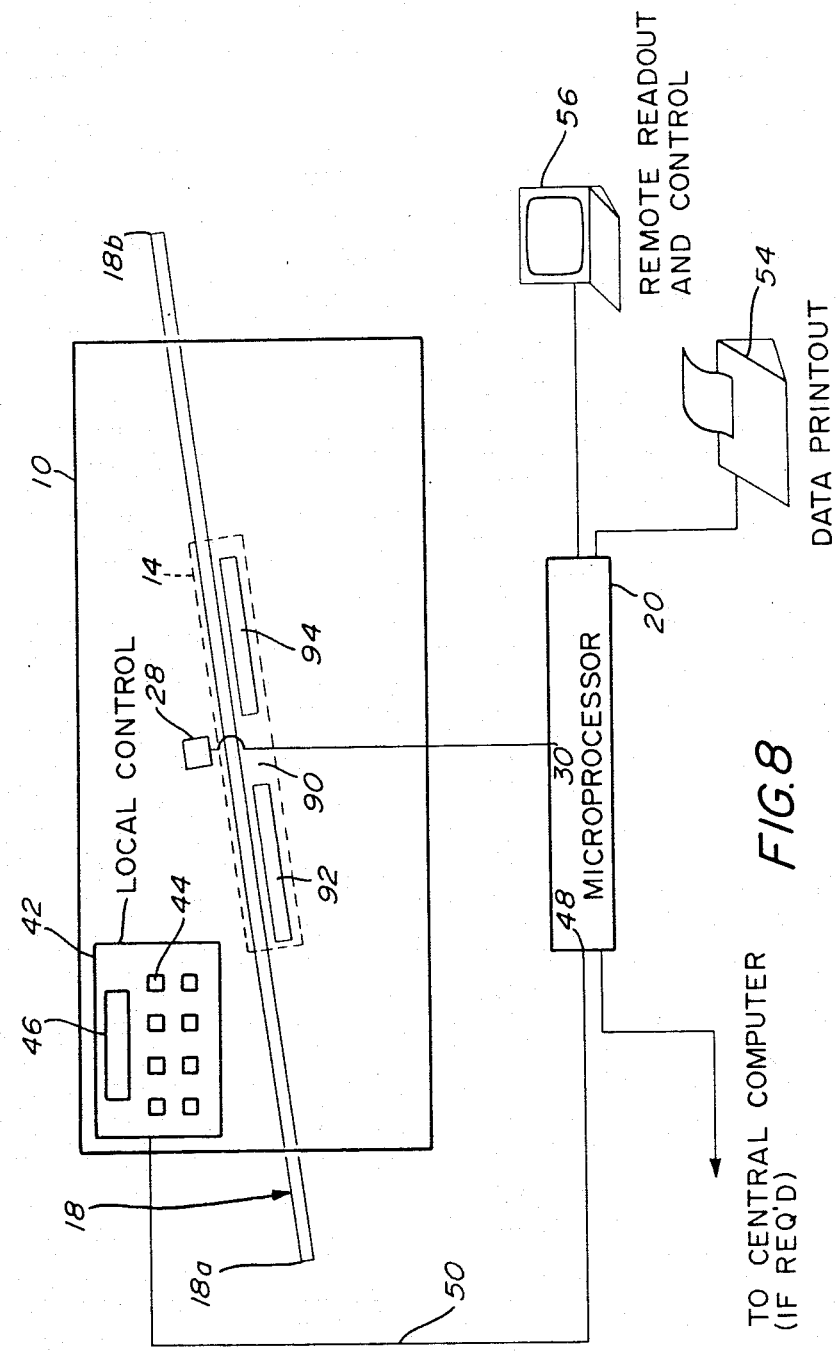

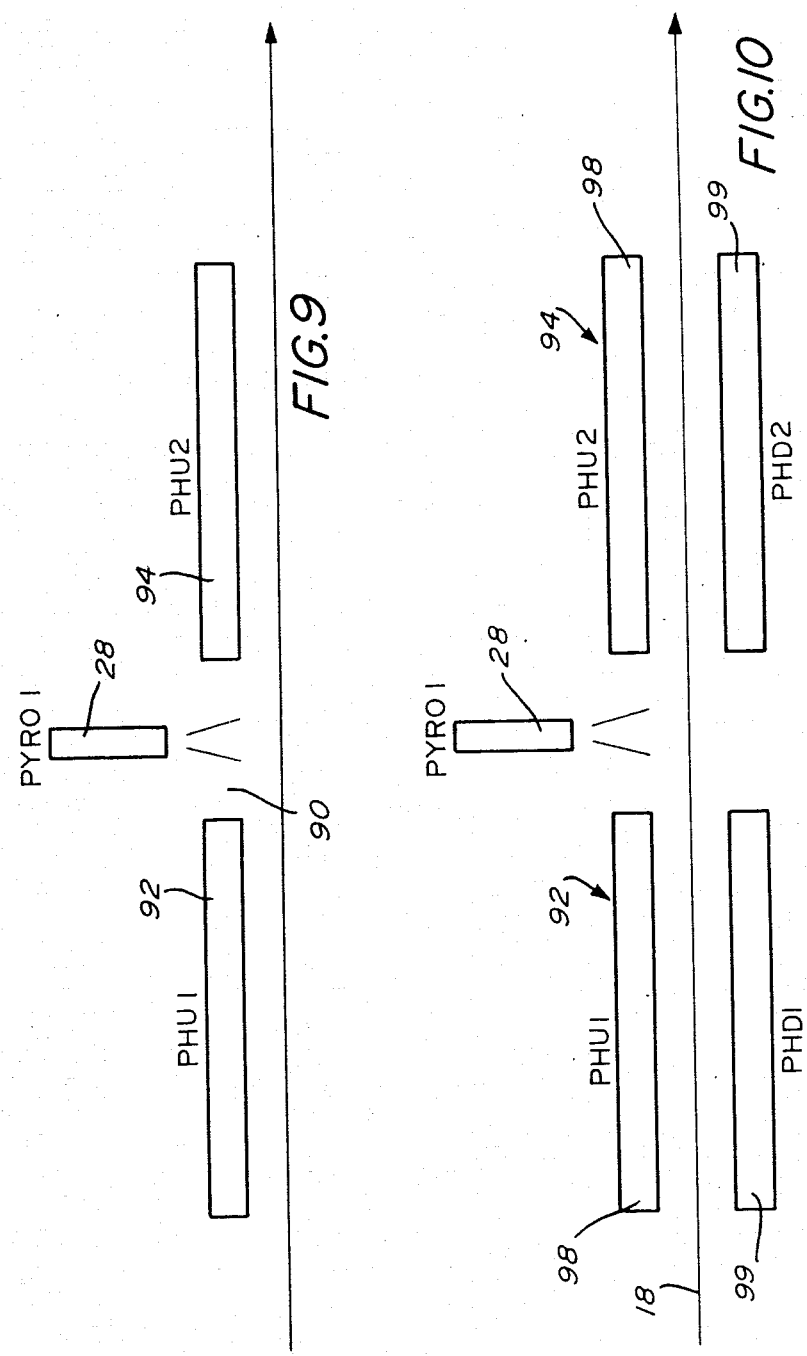

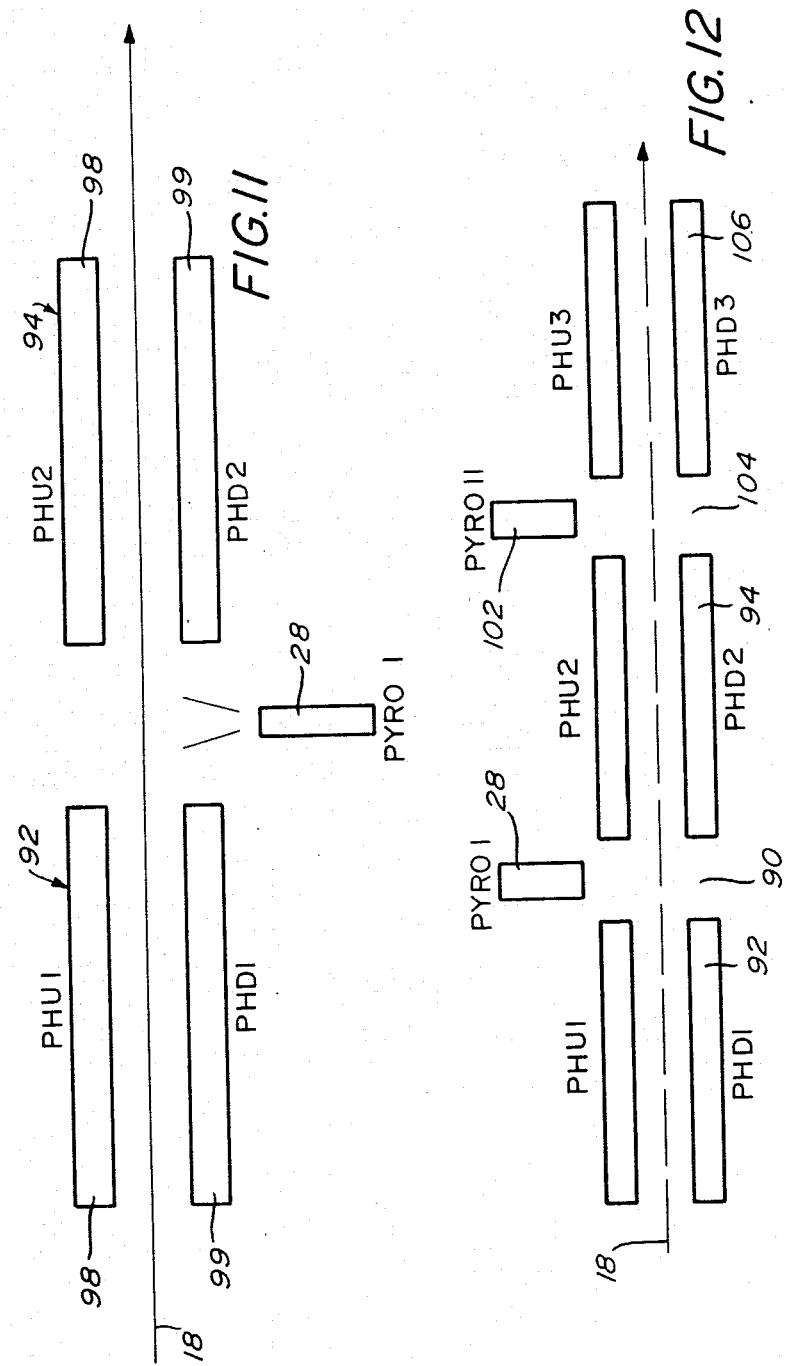

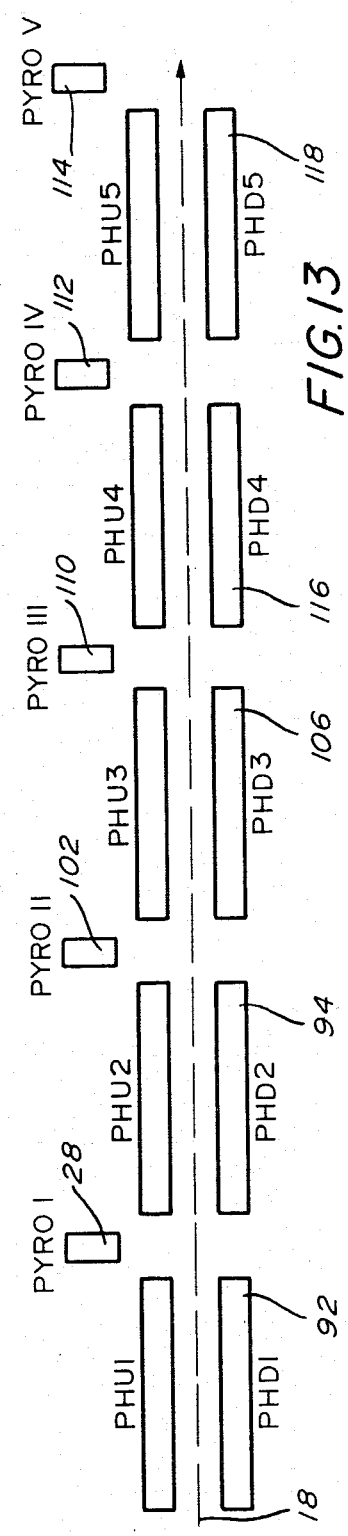

MULTI STAGE HEATER

This application is a continuation-in-part application of U.S. Ser. No. 470,494 filed Feb. 28, 1983.

FIELD AND BACKGROUND OF THE INVENTION

This invention relates to the soldering of printed circuit boards (pcb) or the like in which the boards are passed through a heater prior to soldering. More specifically this invention relates to a heater having at least two stages and a control system for the heater.

Prior machines of this type have been developed in which some of the process parameters have been controlled automatically but, as far as is known, no prior machine has been developed which is capable of completely automatically processing the boards through the various steps necessary to ensure efficient and reliable soldering. Perhaps one reason for this is that prior machines have not been able to achieve the degree of accuracy necessary in preheating the boards to ensure proper soldering. The following discussion brings out the importance of heating control in soldering and other processes.

A wave soldering machine is a machine for soldering components premounted on a printed circuit board to that board. The board is held near horizontal with components on the top surface and their leads projecting through holes in the board. Sometimes small components (chips) may be cemented to the bottom surface of the board. This board is passed over the solder wave, just skimming its surface. During this passage, strong, electrically conductive solder joints have to be formed between the components and the board. A well soldered board has the following joint characteristics.

1. All exposed copper and/or other metallic solderable surfaces of the board and component leads are well wetted by solder.
2. All joints are or have a continuous metallurgical structure.
3. Solder has flowed through joint interspaces and holes in the pcb, partly by capillary action to make sound joints and nice through connections to the top surface of the board.
4. There is no bridging between component leads, pads or tracks on the pcb causing a false circuit.
5. There are no icicles of frozen solder hanging from the bottom of the board.
6. None of the components have been damaged by the temperature of the process.
7. There is no excessive alloying between the leads, or copper of the board and the solder.
8. There is no inclusions or impurities in the solder.

Quite a number of these qualities are affected by the temperature of the board when it meets the solder wave.

Obviously if the board is cold and is taken through the solder wave quickly, the solder will freeze onto the cold board without flowing into confined or restricted areas, joints, holes and the like, and will not be forming good joints between well wetted parts.

To maintain a reasonable soldering speed and, therefore, production rate of boards per day the boards need heating prior to soldering. The heating has to achieve a balance between damage by thermal shock and high temperature to the board and components, or excessive soldering time required to transfer heat from the solder of the solder pot to the board.

Heating the board prior to soldering also increases the activity of the flux which improves the general solderability.

The temperature of the board is a dynamic parameter, with temperature gradients through the board which vary with time. The temperature gradients will decay with time so that a long gap between board heating and soldering will give a cooler, even temperatured board, whereas heating in the solder wave will give a hot lower surface and cold top surface to the board with, therefore, large thermal gradients.

SUMMARY OF THE INVENTION

The heart of the present invention is the heater which has at least two stages. When a board or the like is put in the machine, a microprocessor asks for some details of the board. It asks for the board thickness, and if possible, for a board type. The type is a classification of the board which allows the microprocessor to ascribe a constant to the board to correct for emissivity, conductivity, abnormal plated areas, multilayering of circuits or coatings which may alter heat transfer or thermal capacity. The microprocessor will also allow different temperatures to be selected to, say, protect a particularly delicate component on the board.

From this information, the mciroprocessor will set the heat level of the first stage of heaters. The heaters are arranged in a grid in the direction of the board travel and the microprocessor only switches on the heaters under the board. Since it has already adjusted the conveyor for board width, it knows which heaters cover this area. The heaters in the first section are each 1 kw, and made from a coil of nichrome wire in a quartz tube. The quartz tube is open to the atmosphere at each end. These heaters take from about 40 seconds to 2½ minutes to reach full temperature.

At the end of this section, the board has been heated either so that the whole board is at near soldering temperature or if it requires greater heat input because, say, it is a very thick board, at a level which raises the bottom of the board to the maximum which will not actually damage the bottom of the board, i.e. it is being heated at the maximum rate possible.

As the board reaches the end of this section, it passes under a pyrometer which measures the temperature of the top of the circuit board. The microprocessor compares these readings with required temperature and then takes the appropriate action to boost or maintain this temperature with the second zone of heaters.

Although wave soldering is described herein, the controlled heating of boards and the like is equally applicable with panel type heaters for reflow soldering and other types of soldering. Furthermore, a controlled heater is required for curing epoxy resins in boards or other components containing epoxy resins. A controlled heater is also applicable for drying moisture, solvents and the like from boards and other articles.

A purpose of the present invention is to provide an apparatus and a process that gives a controllable temperature profile to an item. The temperature profile may be varied for both time, temperature and load size as required. The temperature profile is independent of load size or speed through the heater because the temperature sensing device measures and transmits the temperature of the item at the particular location in the heater. Furthermore, the temperature profile can be applied to the item for both heating and cooling. This provides controlled heat ramping both up and down.

Up to now, there has been no known device which accurately controls heated zones or areas in a multi zone heater where the heat source is an I.R. heater or emitter. It has now been found that by using temperature sensing devices that measure the temperature of the item passing through a zone rather than the temperature of the zone itself, a controlled temperature profile for items can be consistently and repeatedly attained.

Accordingly, it is an object of the present invention to provide an improved heater having a plurality of stages and a control system for the heater stages to stabilize the temperature profile of an item independent of size or speed passing through the heater stage or stages.

It is an associated object to provide an improved soldering machine with a controlled heater for automatic soldering of printed circuit boards.

A still further associated object is to provide an improved heater or curing oven and process for curing and/or drying of epoxy or other polymer coatings applied to components, printed wiring boards or assemblies, or for the "baking" of printed wiring boards.

The present invention provides a heater for use in heating items on a conveyor to follow a predetermined temperature profile, the heater comprising first heater means adjacent the conveyor for applying a first quantity of heat to the items, temperature sensing means adjacent the conveyor, deriving signals indicative of the temperature of the items as they exit from the first heater means, second heater means adjacent the conveyor and downstream of the first heater means for applying a second quantity of heat to the items, and control means for comparing signals indicative of the temperature of the items with the predetermined temperature profile, the control means having an input supplied by the signals from the temperature sensing means, a first control output from the control means deriving signals to control heat supplied by the first heater means to affect the temperature of the items exiting from the first heater means, a second control output from the control means deriving signals to control heat supplied by the second heater means to affect the temperature of the items exiting from the second heater means, the signals from the first control output and the second control output correlated by the control means so the items exiting from the second heater means are approximately in accordance with the predetermined temperature profile.

In other embodiments, additional heater means and temperature sensing means are provided. The first temperature sensing means either by itself or in conjunction with other temperature sensing means may be used to predict the required output to any or all of the heater means according to the predetermined temperature profile.

The present invention also provides a process for achieving a predetermined temperature profile for a circuit board transported through at least two heat zones, comprising the steps of: transporting a circuit board through a first heat zone followed by a second heat zone, measuring temperature of the circuit board between the first heat zone and the second heat zone, comparing the temperature of the circuit board with the predetermined temperature profile, and controlling the temperature of the second heat zone so that the temperature of the circuit board follows the predetermined temperature profile and feed back controlling the temperature of the first heat zone for ensuring subsequent circuit boards follow the predetermined temperature profile.

BRIEF DESCRIPTION OF THE DRAWINGS

FIGS. 6A-6D is a schemmatic diagram showing to a larger scale of microprocessor shown in FIG. 1 and particularly illustrating all the various signals applied to inputs of the microprocessor and all the functions controlled by signals derived at the outputs of the microprocessor;

FIG. 8 is a diagrammatic view of a heater according to one embodiment of the invention, the machine having a conveyor for conveying articles past the heater stages;

FIGS. 9 to 13 are diagrammatic views showing different arrangements of heater stages about a conveyor;

DESCRIPTION OF THE PREFERRED EMBODIMENT

GENERAL DESCRIPTION OF THE PROCESS

Figure 1:
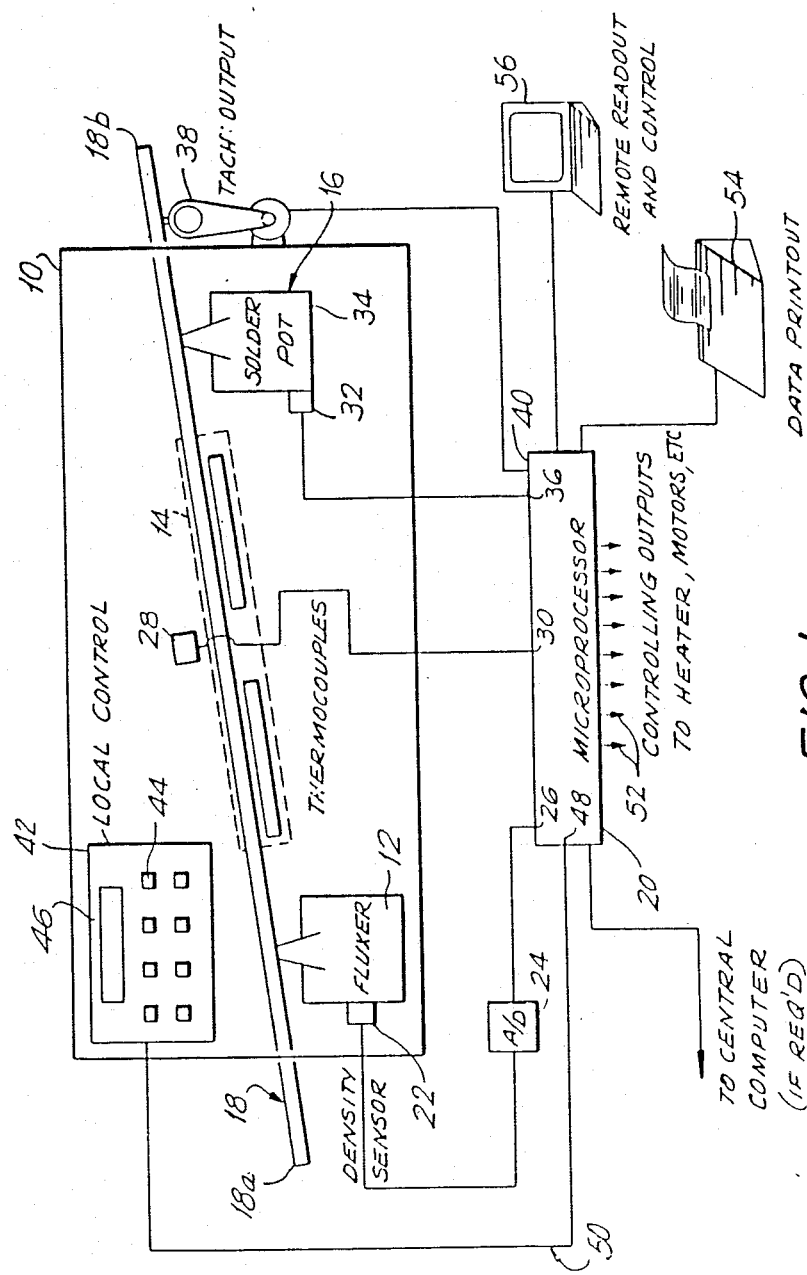
FIG. 1 is a diagrammatic view of an automatic soldering machine according to the invention, showing how the various parameters of the soldering process are controlled.
Figure 6A:
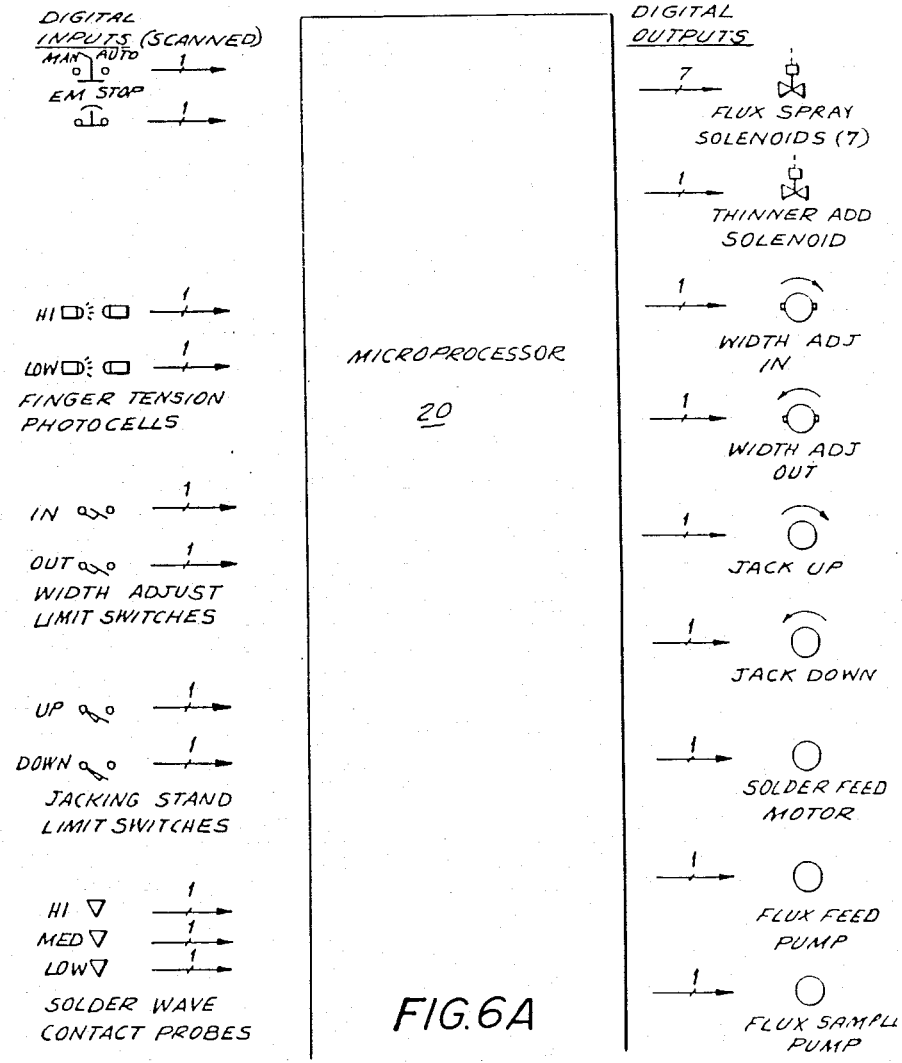
Figure 6C:
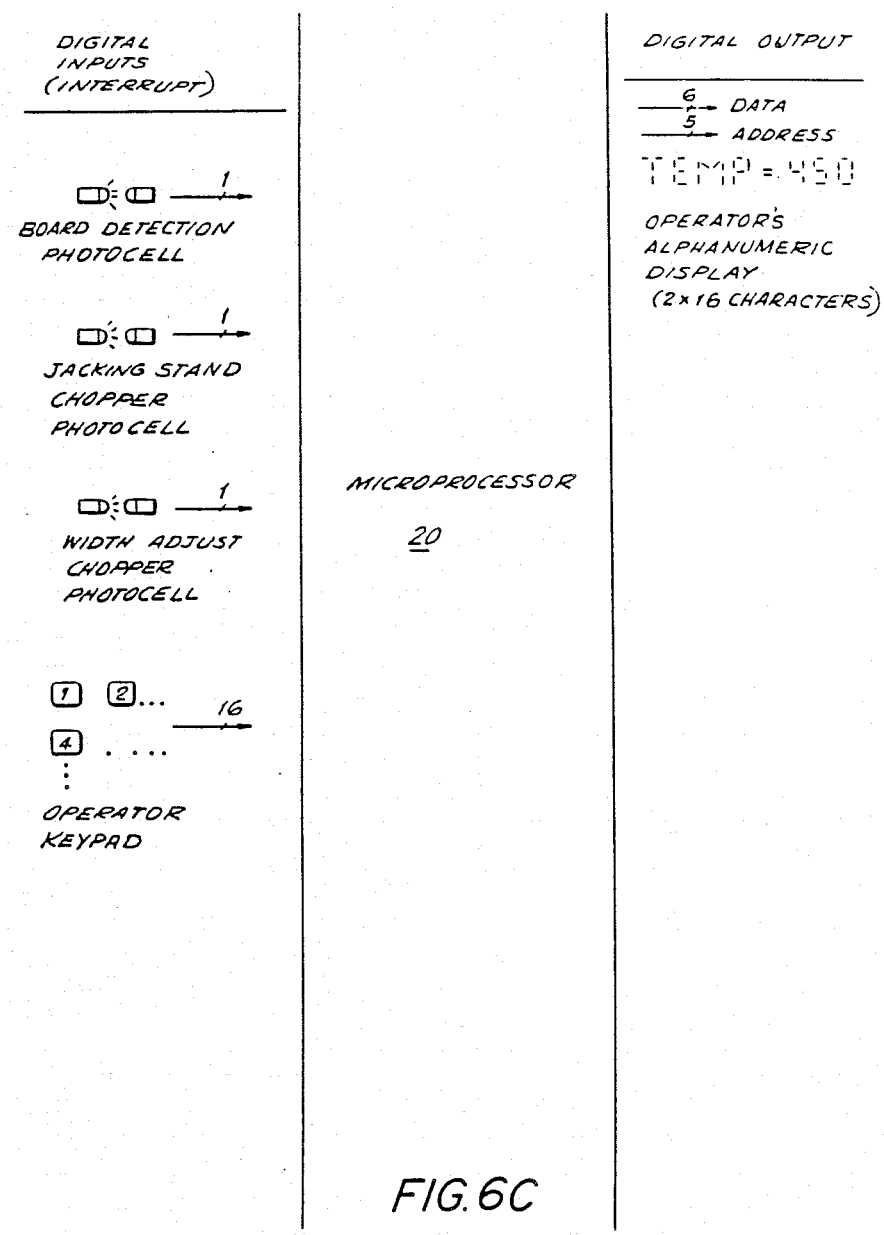
Figure 6D:
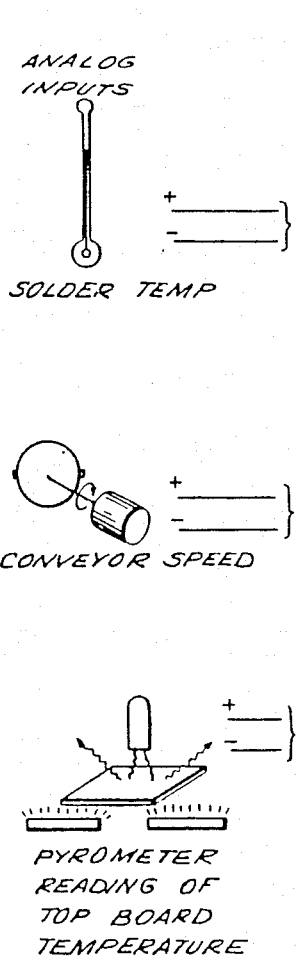
Figure 7A:
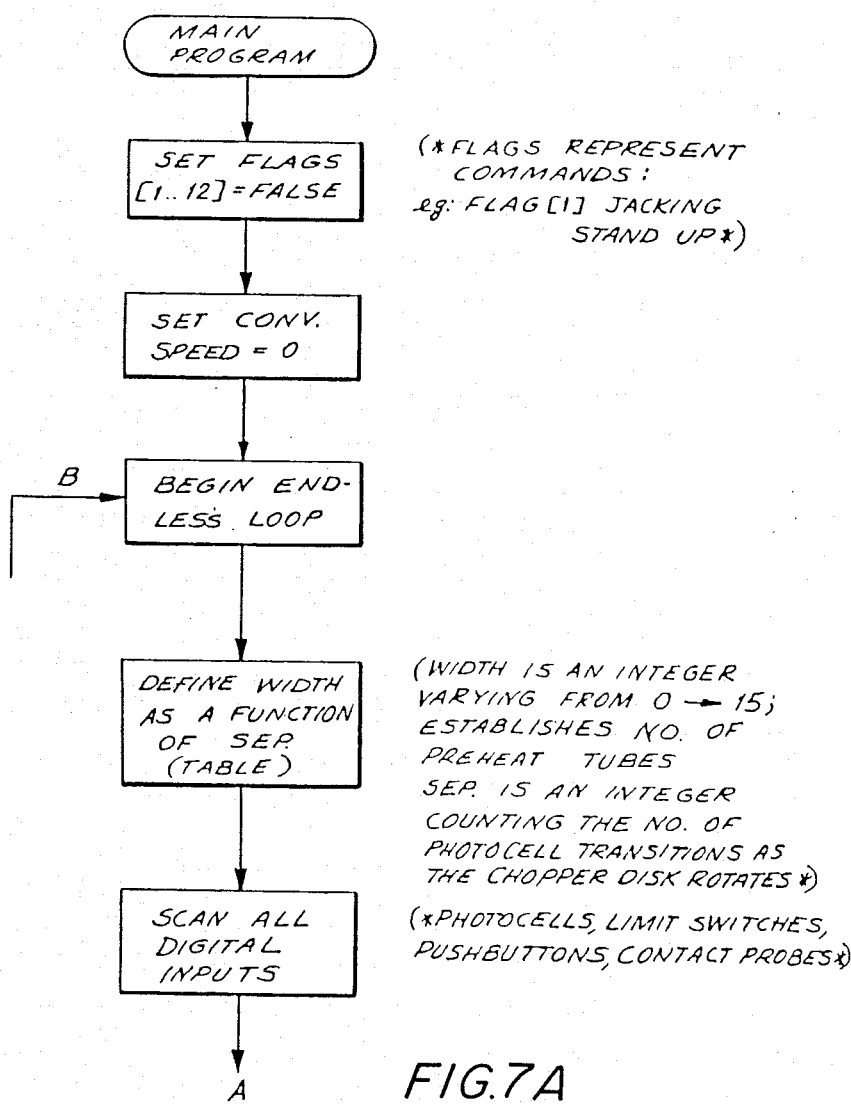
FIGS. 7A-7H is a flow chart illustrating the main program used to control the soldering machine.
Figure 7B:
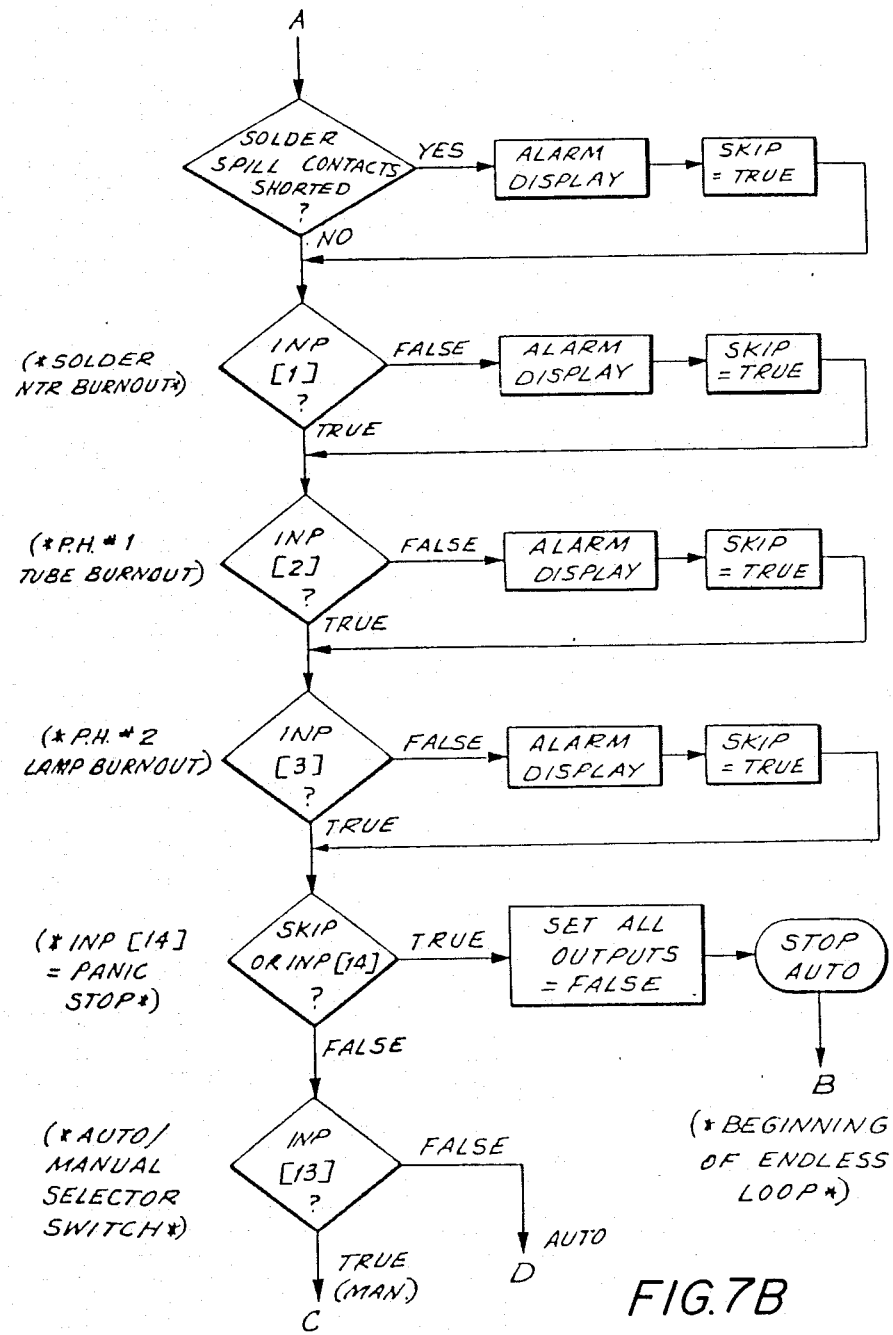
Figure 7C:
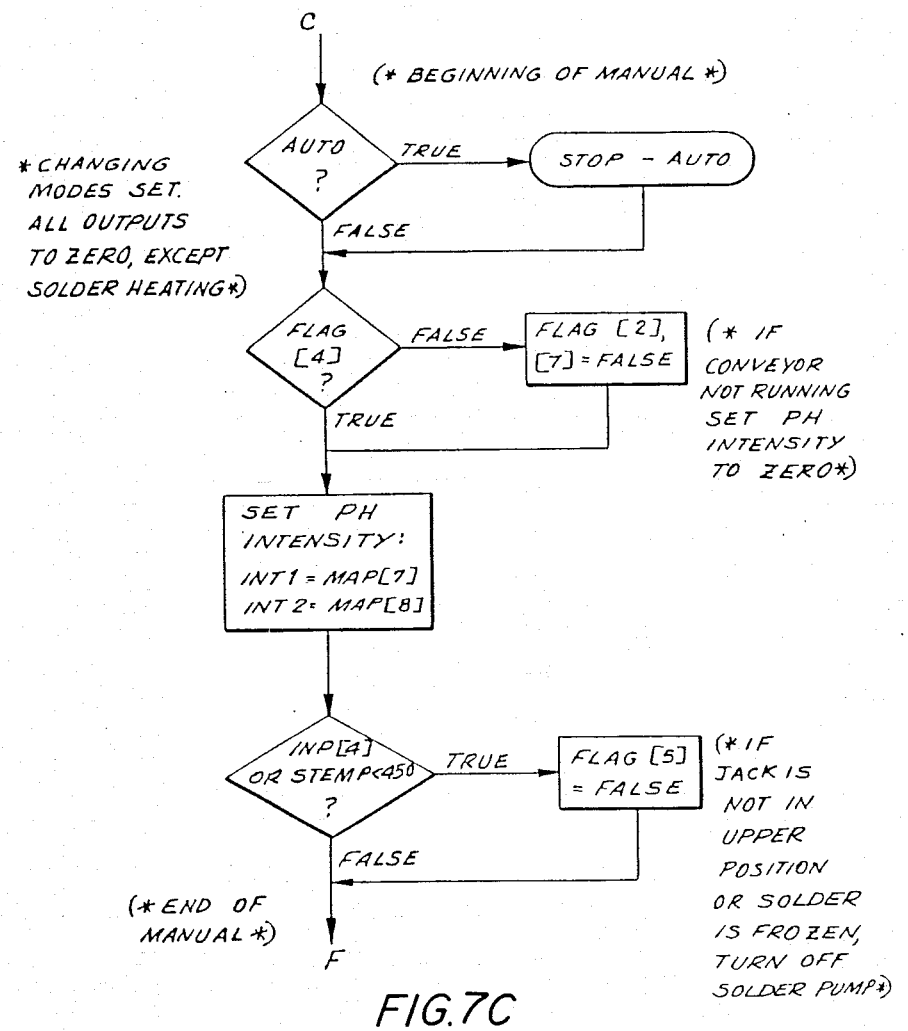
Figure 7D:
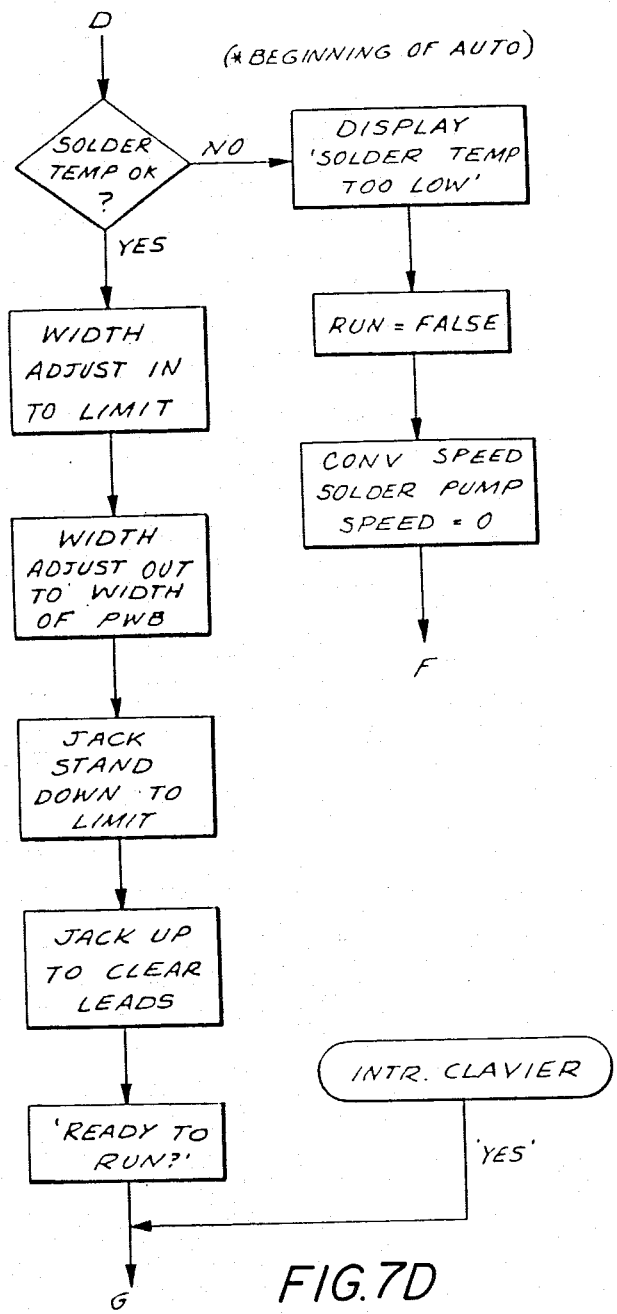
Figure 7E:
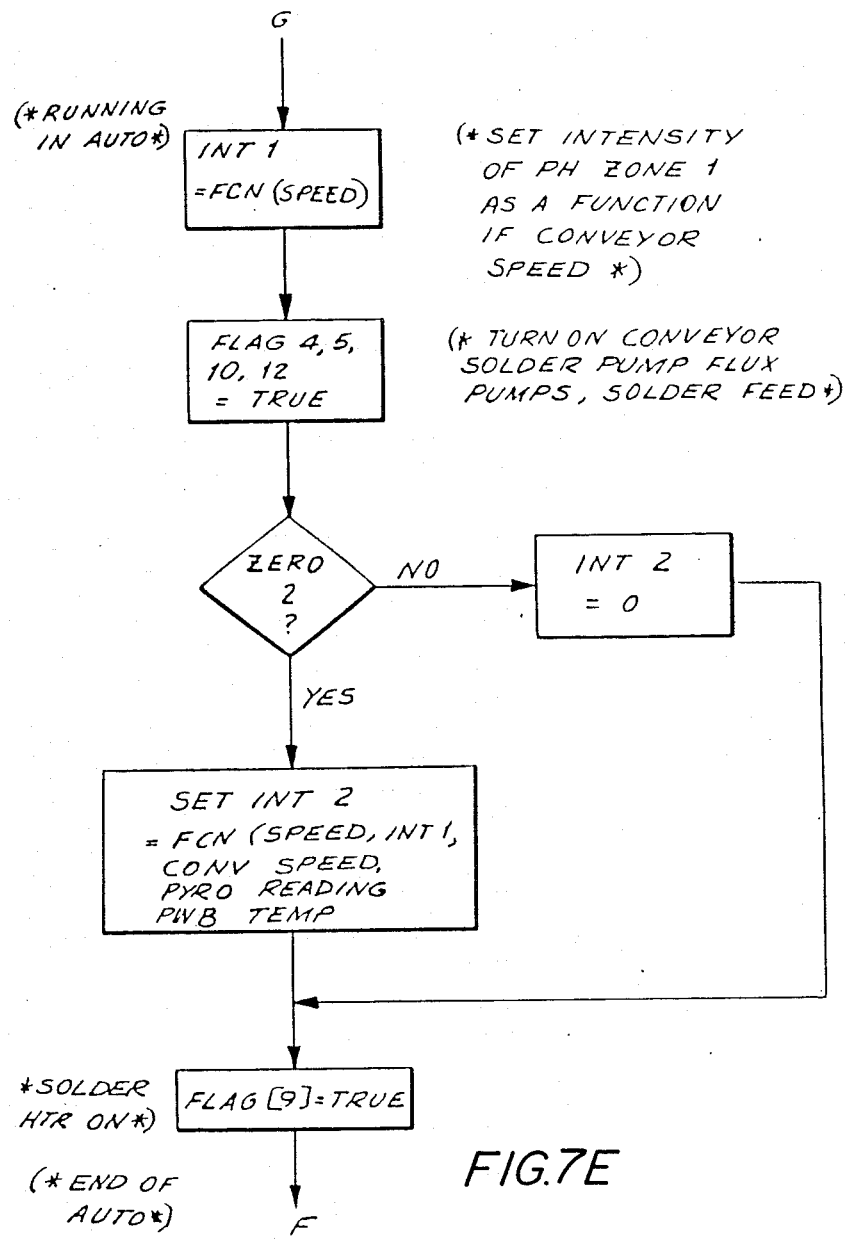
Figure 7F:
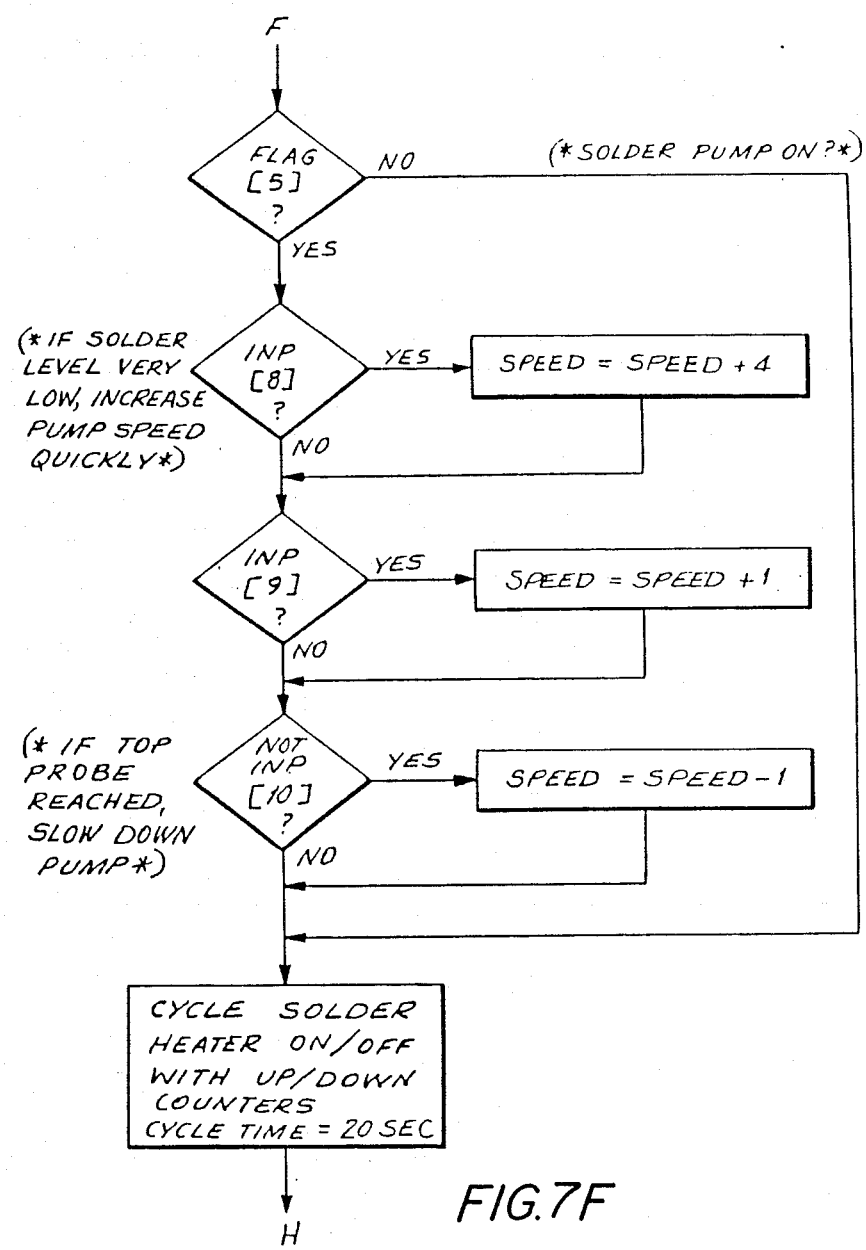
Figure 7G:
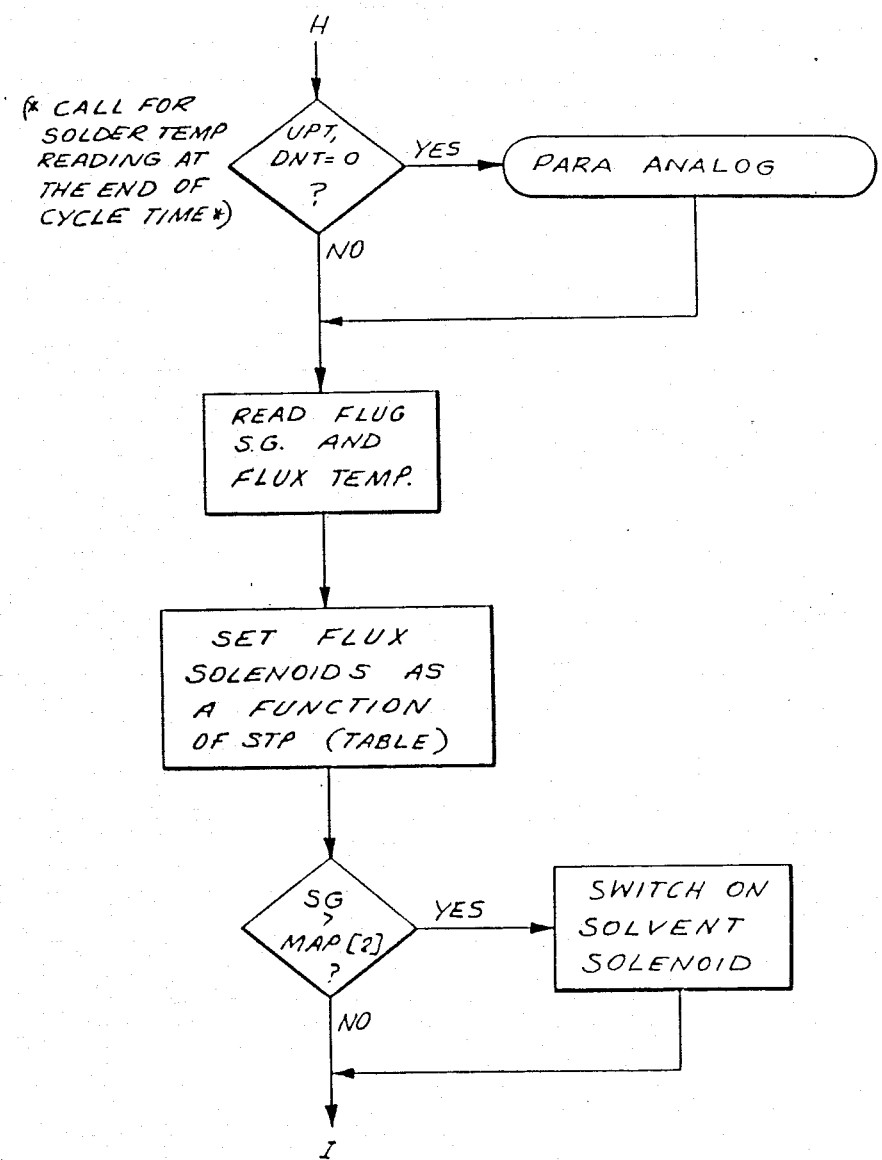
Figure 7H:
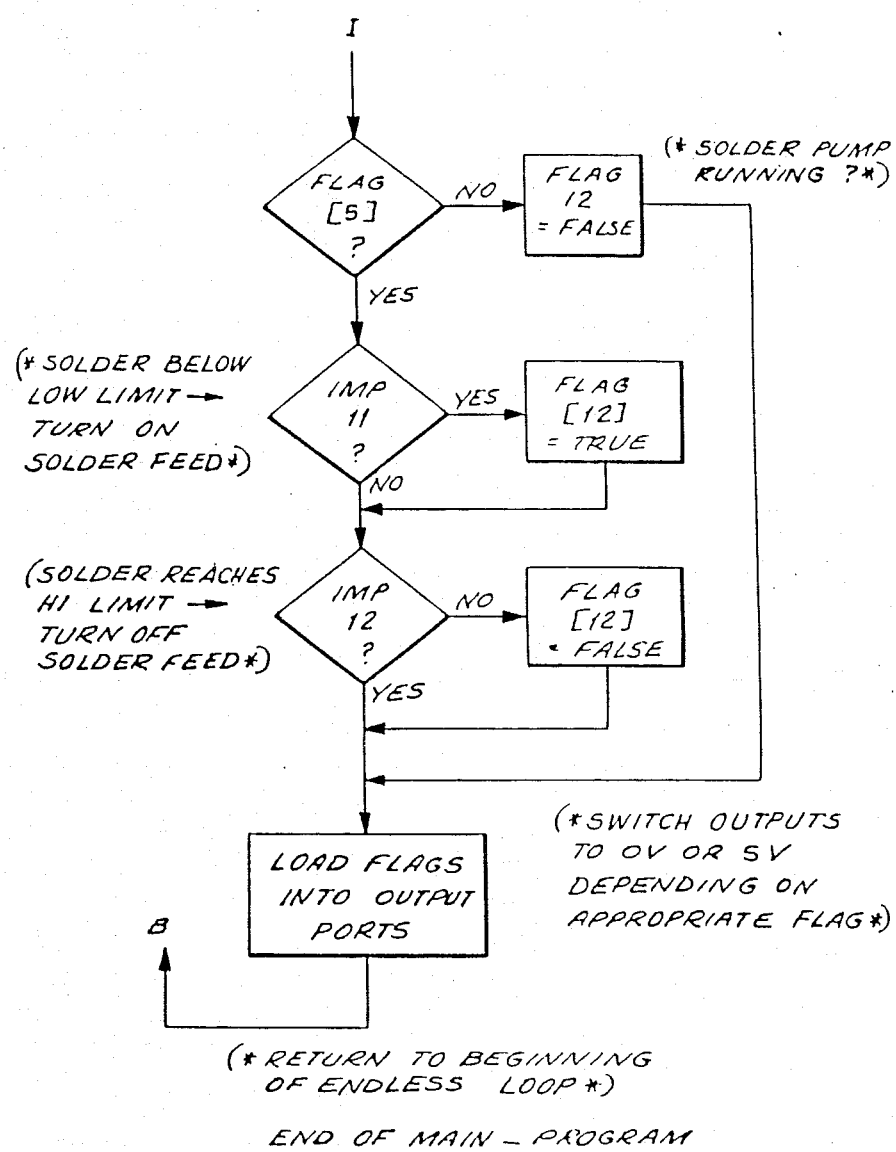

Referring firstly to FIG. 1, this shows diagrammatically some of the main features of the automatic soldering machine of the invention, but various features have been omitted from this figure in the interests of clarity. The complete list of features will be described with reference to other figures, particularly FIG. 6. The soldering machine with reference to other figures, particularly FIG. 6. The soldering machine is generally referenced 10, the three principal sections of which are a fluxer section 12, a preheater section 14 and a soldering section 16. A conveyor 18 inclined at a preset angle, which can be varied between 4 degrees and 7 degrees with respect to the horizontal, extends entirely through the machine from a low input end 18a just before the fluxer section to a high output end 18b just after the soldering section. Conveyor 18 is designed to transport printed circuit boards from input end 18a where they are loaded, to output end 18b where they are unloaded, through progressively the fluxer section 12, the preheat section 14 and the soldering section 16. The printed circuit boards are not shown in FIG. 1, but they are secured with the side to be soldered facing downwardly so that it can be coated with flux in fluxer section 12 and after preheating of the board in preheat section 14, it can then pass through a solder wave in soldering section 16 to solder terminals on the underside of the board.

Various parameters essential to efficient operation of the soldering process can be monitored, interrelated and controlled automatically under control of a microprocessor. Only a few of the many control functions available are illustrated in FIG. 1. For example, the flux density of the flux used in the fluxer section 12 is measured using a vibration chamber type density meter 22. The output signal from the density meter is converted in A/D converter 24 to a digital signal fed to an input 26 of microprocessor 20. A pyrometer 28 for sensing the temperature of the printed circuit boards as they pass through the preheat section 14 is also shown in FIG. 1, this pyrometer deriving an analog signal which is fed to an analog input 30 of microprocessor 20. A thermocouple 32 located in a solder pot 34, constituting the major componet of the soldering section 16, is provided for sensing the solder temperature and, again, the analog signal derived is fed directly to microprocessor 20, this time via analog input 36.

The speed of the conveyor 18 is measured by means of a D.C. tachogenertor 38, the signal generated being fed via a voltage divider (not shown) to an analog input 40 of microprocessor 20.

A control console 42 includes a keyboard 44 which permits data pertinent to the process and to the boards being processed to be entered by an operator and also includes a display screen 46 on which data entered can be displayed temporarily on or which parameters sensed can be displayed as called for. Control console 42 is conected to a digital input/output port 48 by means of a cable 50.

Depending on the data entered into the microprocessor 20 via the control console 42 and via the various sensors such as sensors 22, 28, 32 and 38, the various process parameters such as flux density, board preheat temperature, solder temperature and conveyor speed can be interrelated and controlled by appropriate signals emanating from outputs of mcroprocessor 20. The overall process control will be described in greater detail below, but first the control of the board preheat, which is considered to be an important aspect of the invention will be described. Before moving on from FIG. 1, the presence of a data printer 54 and a remote readout and control console 56 should be noted. These are optional items which can assist in overall control of the soldering process.

PREHEAT SECTION

Figure 2:
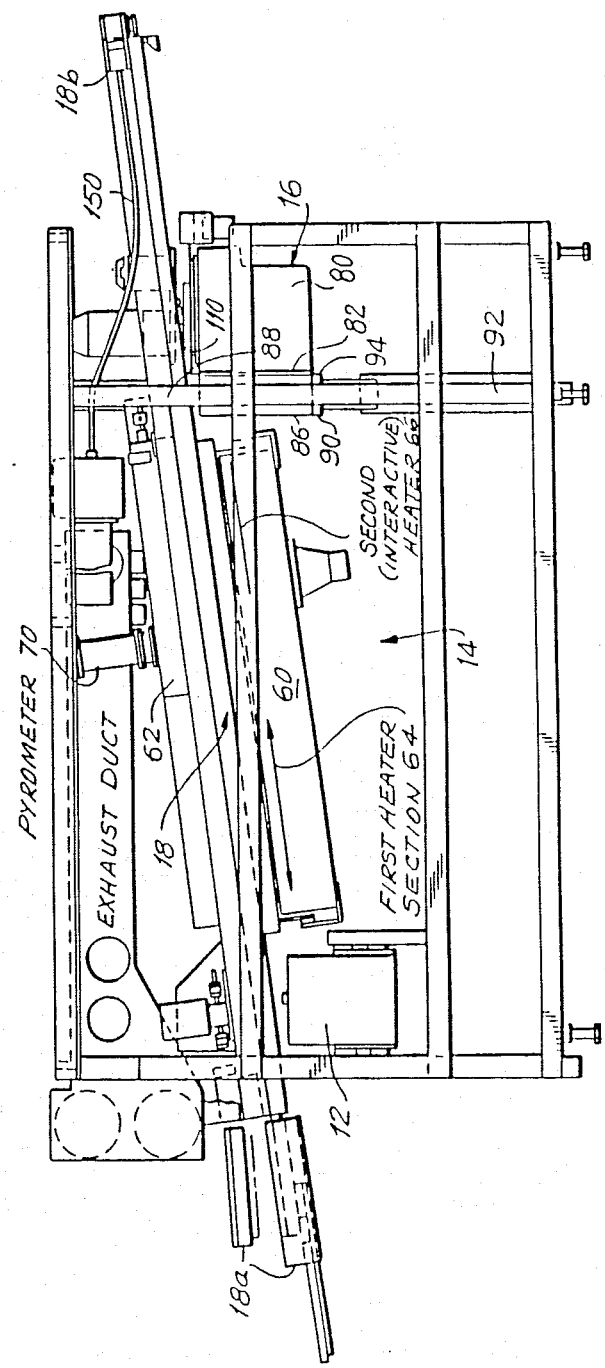
FIG. 2 is a side view of the soldering machine illustrated diagrammatically in FIG. 1, with the external housing removed for clarity.
Figure 3:
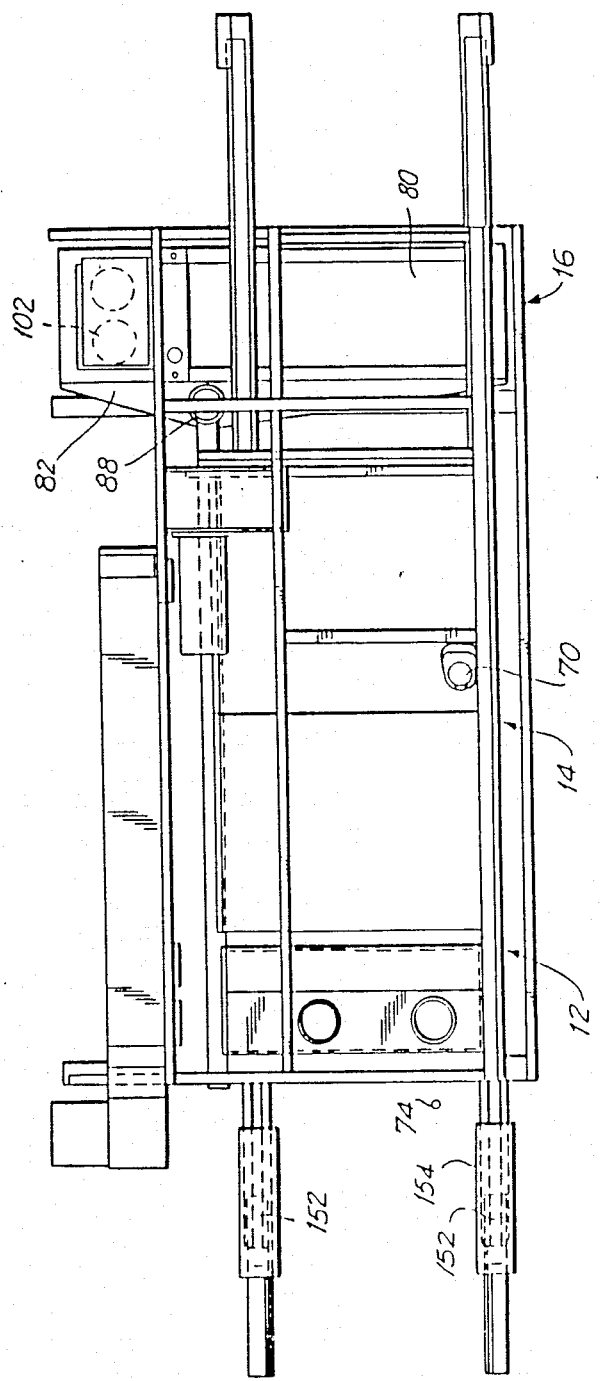
FIG. 3 is a plan view of the soldering machine of FIG. 2.
Figure 4:
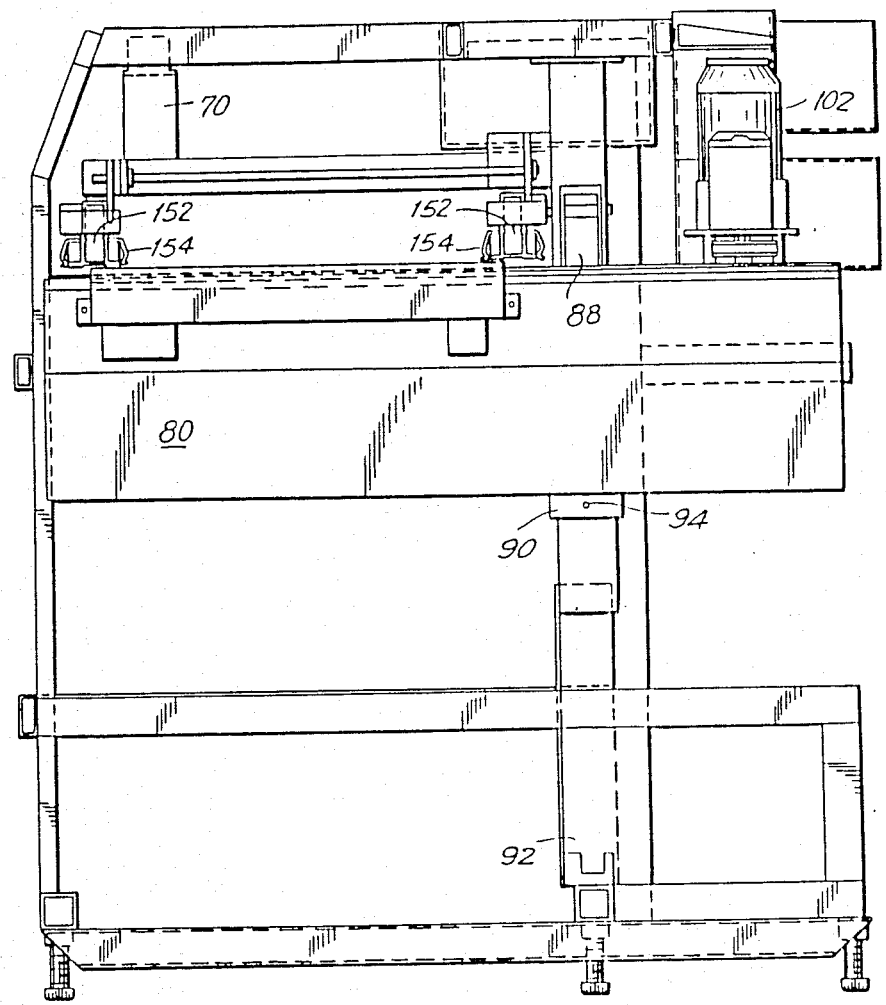
FIG. 4 is a rear view of the soldering machine looking in the direction of the arrow A in FIG. 3.
Figure 5:
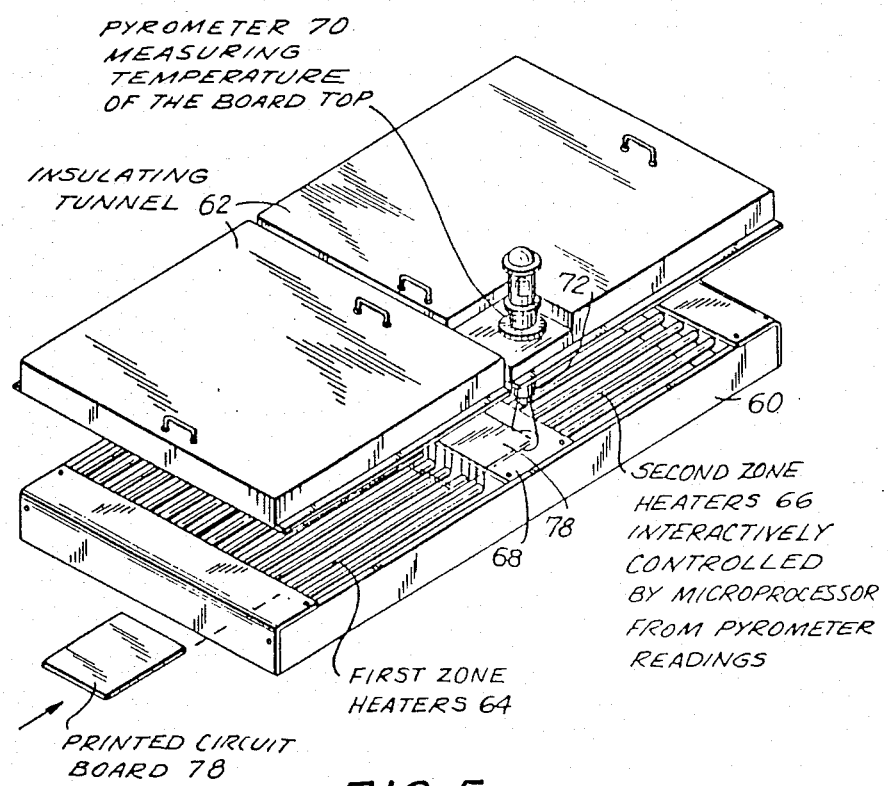
FIG. 5 is a perspective view showing a two stage preheating assembly used in the automatic soldering machine of the invention.

Referring now to FIGS. 2, 3 and 5, particularly FIG. 5, the conveyor 18 passes between a heater assembly 60 located below the conveyor and an insulating cover 62 located above the conveyor and aligned with the heater assembly. More particularly, the heater assembly 60 comprises a first bank of fifteen heaters 64 running parallel to the conveyor axis and a second bank of fifteen heaters 66 also running parallel to the conveyor axis, the second bank being deplayed downstream of the first bank and separated from the first bank by a short non-heating zone 68.

The heaters 64 are all identical, each comprising a 1 kw nichrome wire coil in an open ended quartz tube. These heaters take from about 40 seconds to 2½ minutes to reach full temperature of approximately 980 degrees C. The heaters 66 are also 1 kw, but they have a very fast response time reaching a high temperature within a few seconds. These heaters are formed with a filament in a sealed quartz tube and have a maximum temperature of around 2200 degrees C.

The two banks of heaters are connected to a power source via relay contacts or similar switch means (not shown) under control of the microprocessor. The level to which a particular bank is energized is selected by the processor in the range 0–15 and, to this end, a variable controller is provided.

Mounted on the insulating cover 62 is a pyrometer 70 (reference 28 in FIG. 1), the temperature sensitive portion 72 of which projects through to the underside of insulaying cover 62 in alignment with the non-heating zone 68 separating the two banks of heaters. It can also be seen that the pyrometer is not located centrally with respect to the width of the heater banks, but is located adjacent one side, the front side as seen in FIGS. 3 and 5. The reason for this is that as will be described below, the width of the conveyor 18 is adjustable to accommodate different widths of circuit boards. By locating the pyrometer at one side the conveyor 18 and hence boards will always pass below the pyrometer, irrespective of the conveyor width adjustment.

FIG. 3 shows the portion of a sensor 74 which senses the leading and trailing edges of the printed circuit boards. The sensor 74 is preferably a photodetector of known type, which is connected electrically to the microprocessor 20 so as to signal the positions of the boards to the microprocessor.

The operation of the preheat section will now be described. As indicated above, data pertinent to a particular board can be entered by an operator via console 42. With regard to the operation of the preheat section, the operator would enter a desired value or set point (CB set point) for the top side preheat temperature of the circuit boards. The desired conveyor speed would also be entered via the console. Other data which would be entered via the console 42 would be the board thickness and probably also board type. The board type is a classification of the board which allows the microprocessor 20 to ascribe a constant to the board to correct for emissivity, conductivity, abnormal plated area, multilayering of circuits or coatings which may alter the heat transfer or thermal capacity characteristics of the boards.

After completion of a start-up sequence to be described in detail below, the operator enters a "run" instruction via console 42 at which the microprocessor 20 instructs various functions including running of the conveyor 18 and energization of the first bank of heaters 64. The level of energization of the heaters 64 is set by the micoprocessor as a function of the conveyor speed, the temperature profile and the board data entered previously by the operator. As the circuit boards 78 pass the sensor 74, the leading and trailing ends are detected and this information passed to the microprocessor 20. When the boards emerge from the fluxer section 12, they enter the preheat section 14 where they are heated by the first bank of heaters 64 so that as they emerge into the non-heating zone 68, they are following the temperature profile entered previously by the operator. In some cases, particularly where the board requires greater heat input because it is, say, thick, the temperature of the board will be rather lower because the board bottom would be subject to damage if too much heat were applied by the heaters 64.

The boards 78 then pass under pyrometer 70 which measures the infrared radiation emanating from the board 78. The pyrometer is instructed by microprocessor 20 to take twenty readings 0.1 inch apart and these twenty readings are sent to the microprocessor where they are averaged. The correct timing for beginning the readings is established by the microprocessor as a function of the leading edge signals provided by position sensor 74 and the conveyor speed.

Essentially the weighted average of the temperature readings provided by the pyrometer is compared in microprocessor 20 with a predetermined temperature profile and the microprocessor then sets the level of the second bank of heaters 66 at a level of intensity so the boards follow the predetermined temperature profile. However, as the pyrometer is measuring indirectly the temperature of the baords by measuring the heat radiated from the boards an algorithm has to be derived to relate the pyrometer measurements to required intensity level. The following algorithm represents one way of establishing the intensity level of heaters 66:

$$\text{THETA} = \frac{(CB\ \text{TEMP}^* - \text{TEMP}^*_0{}^*) \times \text{SPEED}}{\text{CONST}_2}$$

$$\text{THICKNESS} = \frac{\text{CONST}_3 \times \text{INTENSITY}_1 - \text{THETA}}{\text{CONST}_4 \times \text{INTENSITY}_1}$$

$$A = \frac{(\text{THICKNESS})\frac{1}{2}}{2}$$

$$B = \frac{\text{THETA} \times A \times \text{CONST}_5 + CB\ \text{TEMP}}{\text{SPEED}}$$

$$C = \frac{(CB\ \text{SET POINT})^{***} + A \times B}{1 + A}$$

$$\text{ALPHA} = [(C - B) \times \text{SPEED}]/\text{CONST}_6$$

INTENSITY (intensity of heaters 64) = $\text{CONST}_1 \times \text{SPEED}$

INTENTSITY$_2$ (intensity of heaters 66) =

$$\text{ALPHA}/(\text{CONST}_7 - \text{CONST}_8 \times \text{THICKNESS})$$

*Measured by pyrometer after 1st zone
**May be maximum or average depending on program initial board temperature.
***Entered by operator via keyboard Switching on of heaters 66 is triggered by leading edge pulses from position sensor 75 taking into account the conveyor speed so that heaters 66 are energized just before a board 78 arrives under them. Switching off of heaters 66 is also controlled by the microprocessor 20 as triggered by the trailing edge pulses emanating from position sensor 75.

Although in conventional wave soldering technology it might seem logical to measure the temperature of the underside of the P.C. Board since this is the surface to be soldered, in practice this would not supply the microprocessor with useful figures from which it could effectively control the second heater zone. The underside temperature when measured soon after the first heating zone tells us little except at what value the heaters were set—something we already know. Two pyrometers could be used on the lower surface of the board with a time delay between to measure the temperature decay which could yield the information required by the miroprocessor, but this is a less efficient method than taking top surface temperature.

PROCESS CONTROL FUNCTIONS

As indicated above, FIG. 1 illustrates sensors and microprocessor outputs for monitoring some of the process parameters. For a more detailed indication of the controllable parameters reference is now made to FIG. 6 which shows all of the inputs to and outputs from the microprocessor.

FIG. 7 is a flow chart of the main control program. It is believed that a suitable program listing could easily be derived from this flow chart and, accordingly, the present disclosure is complete without including such program listing.

FIG. 8 shows diagrammatically a heater according to one embodiment of the invention which is not specifically linked to a soldering machine. The figure is substantially the same as FIG. 1, but avoids the fluxing and soldering features. The heater section 14 of the machine 10 has a conveyor 18 which is inclined at a pre-set angle from a low input end 18a to a high output end 18b. The slope of the conveyor 18 is merely illustrative of one embodiment, but is not limiting. The conveyor could be horizontal or need not even be in a single plane. When the heater is used with reflow soldering, then the conveyor may change direction into a heating compartment or area. The temperature sensing device 28, such as a pyrometer, senses the temperature of items on the conveyor 18 in a space 90 between the first heater panel 92 and the second heater panel 94, thus the sensing device 28 derives a signal indicative of the temperature of the item as it leaves the first heater panel 92. This signal is fed to an analog input 30 of a microprocessor 20.

One of the keys of the present heater is to heat the items passing on the conveyor to a predetermined temperature profile. The control function from the microprocessor besides controlling the setting of the second heater panel 94 by utilizing the input from the temperature sensing device 28 also controls the temperature setting of the first heater panel 92. By controlling the two heater panels 92 and 94, the temperature profile is stabilized. The microprocessor takes into account conveyor speed, deviations from earlier readings of the heat sensing device 28 including drift of environmental temperature due to general heat-up etc. The temperature sensing devices sense the temperature of the items at a particular location on the conveyor, so the temperature profile is not dependent ont he size of the items or the speed of the conveyor.

The type of heaters that may be used vary depending upon the heat environment required. Infrared heaters are suitable. The heaters may be rod type, panel type, fused quartz type, or tubular type with I.R. lamps having filaments therein. This latter type of heater tends to give an almost instant on/off heat which is suitable for accurate heat control. In the case of an infrared heater, the infrared emission can be varied to produce different temperature ranges, alternatively, the on/off control may be used so that the heater is either on or off to produce a substantially constant heat when the heater is on. In some heaters, foils may be used to produce a more uniform distribution of heat across the panels. Other types of heaters include ceramic heaters or heaters covered with dark metal plates. The heater panel may be made of insulating material with holes for I.R. heaters left therein. Infrared heaters are particularly suitable for reflow soldering.

The temperature sensing device 28 is in one embodiment a pyrometer, however, other types of temperature sensing devices that measure the temperature of items exiting from the first heater panel 92 may be used. The pyrometer looks through a hole left in an insulated area between the two heater panels 92 and 94. The background of the pyrometer should preferably be cool so that it does not get any distortion from the background and only measures the temperature of the items passing on the conveyor.

FIG. 9 illustrates the heating panels 92 and 94 positioned above the conveyor 18 whereas FIG. 8 shows the heater panels 92 and 94 below the conveyor 18. The location of the heater panels is dependent upon the type of heaters used and also the particular items being heated. If, for instance, the items have any deposits falling from them, then it is preferable to have the heater panels on top and not underneath where they may collect deposits. FIGS. 10 and 11 illustrate the first heater panel 92 and second heater panel 94 formed of upper panels 98 and lower panels 99. The control system is arranged in the same manner as previously described including the upper and lower heater panels of the first heater panel 92 and the upper and lower heater panels of the second heater panel 94. Adjustments can be made to differentiate between the upper and lower heater panels either by a linear differential or a non-linear differential function. The difference in heat between the upper and lower heater panels can be maintained either as a fixed, a linear sliding scale or a non-linear sliding scale difference.

FIG. 11 is similar to FIG. 10, but illustrates the temperature sensing device 28 located below the conveyor 18, rather than above.

The figures all illustrate a space between heater panels and the temperature sensing device positioned in a space. However, the heater panels may be adjacent to each other with little or no space between panels. The temperature sensing devices may be positioned at the side, or at any convenient location provided they can determine the temperature of the items on the conveyor as they leave the particular heating zone.

FIG. 12 illustrates another embodiment having a second temperature sensing device 102 positioned in a space 104 directly after the second heater panel 94. Furthermore, a third heater panel 106 is positioned adjacent the conveyor 18 after the space 104 where the second temperature sensing device 102 senses the temperature of the items leaving the second heater panel 94. The control of this embodiment may be carried out in a number of ways. In one embodiment, the first temperature sensing device 28 directly controls the second heater panel 94 and the second temperature sensing device 102 directly controls the third heater panel 106. The second heater panel 94 may be controlled either by the first temperature sensing device 28 or the second temperature sensing device 102, but not by both.

Another control system for the arrangement of heat as shown in FIG. 12 is for the first temperature sensing device 28 to control the first heater panel 92 and to predict the heat requirements from the second heater panel 94 and the third heater panel 106. This prediction is according to a linear or non-linear prediction control model. The second temperature sensing device 102 is used to correct the settings in the second heater panel 94 and third heater panel 106, that is to say, fine tune the settings in error terms or non-linear terms. Non-linear terms include entering connecting factors in non-linear parameters into the control function.

In another embodiment, the first heater panel 92 is controlled by the first temperature sensing detector 28 and the second heater panel 94 and third heater panel 106 are controlled and predicted by a weighted average of the signals from the first temperature sensing device 28 and the second temperature sensing device 102. This prediction control uses a linear or non-linear prediction control model.

FIG. 13 is an expansion of the configuration shown in FIG. 12. Again the main effort being to produce a selected temperature profile for the items conveyed through the heater. Several heater panels are controlled, some of which may be optional. In one embodiment, the temperature sensing devices 28, 102, 110, 112 and 114 are located directly after the heater panels 92, 94, 106, 116 and 118. Each temperature sensing device controls the up-stream heater panel and in another embodiment, each temperature sensing device controls both the up-stream and down-stream heater panels. This second embodiment requires a weighted average of two temperature measurements from heater panels to control the intermediate heater panels. Again, the prediction control of the heaters is by means of a prediction control model which may be linear or non-linear. In another embodiment, each temperature sensing device controls the downstream heater panel.

Figure 14:
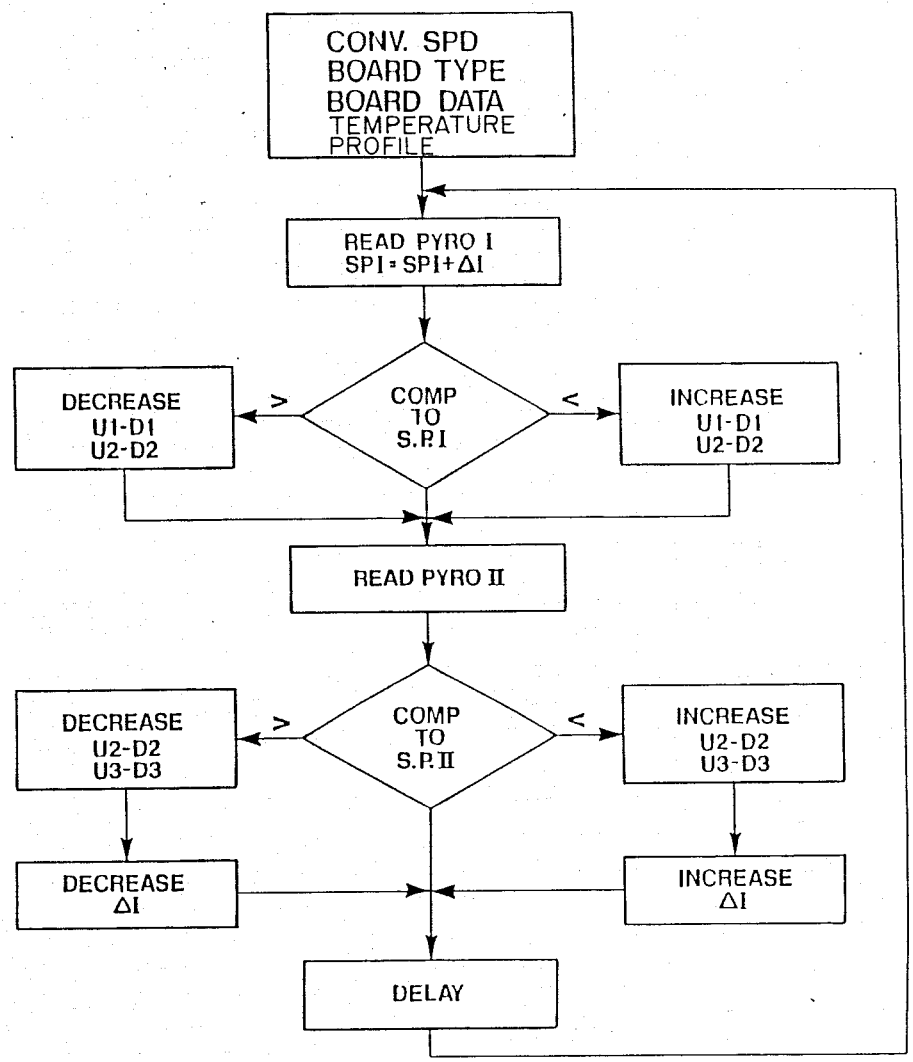
FIG. 14 is a flow chart illustrating one embodiment of a program showing how the heaters are controlled when a circuit board follows a predetermined temperature profile.

FIG. 14 is a flow chart typical for the heater arrangement of FIG. 12. The temperature sensing device (PYRO) determines temperature and compares it with the set point (S.P.). The set point form part of the predetermined temperature profile. The deviations ($\Delta$) and delay are predetermined to provide an even distribution of heat and controlled heat ramping. A suitable program listing can be derived from this flow chart and, therefore, the present disclosure is complete without including such a program listing.

Figure 15:
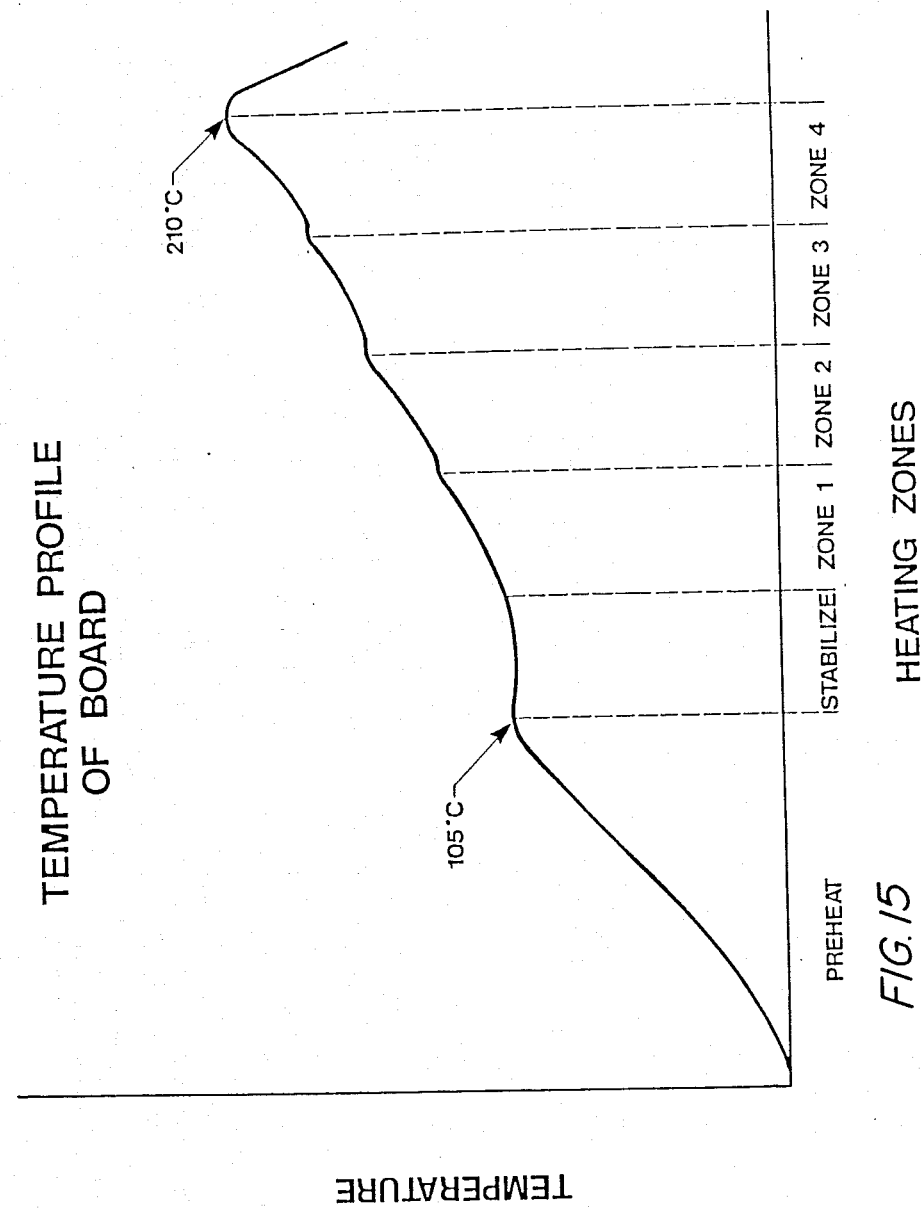
FIG. 15 is a chart showing one embodiment of a temperature profile for a board.

A typical temperature profile for a circuit board is illustrated in FIG. 15. A pre-heat zone is shown to heat the board up to a first temperature followed by a stabilizing zone. Four sequential zones then heat up the board so that it follows the desired profile. Such a profile is determined experimentally for specific types of boards and other items to be heated. In one embodiment the profile may heat ramp a board up and down.

While a specific embodiment of the invention has been shown and described in detail to illustrate the application of the principles of the invention, it will be understood that the invention may be embodied otherwise without departing from the scope of the invention. For example, the novel preheater section could be incorporated in a machine which does not exhibit all the features of the preferred embodiment.

The embodiments of the invention in which an exclusive property of privilege is claimed are defined as follows.

1. A heater for use in heating items on a conveyor to follow a predetermined temperature profile, the heater comprising first heater means adjacent the conveyor for applying a first quantity of heat to the items, at least one temperature sensing device adjacent the conveyor for deriving signals indicative of the temperature of the items, but not the temperature of the heater means, as they exit from the first heater means, second heater means adjacent the conveyor and downstream of the first heater means for applying a second quantity of heat to the items, and control device for comparing signals indicative of the temperature of the items with the predetermined temperature profile, the control means having an input supplied by the signals from the temperature sensing means, a first control output from the control means deriving signals to control heat supplied by the first heater means to affect the temperature of the items exiting from the first heater means, a second control output from the control means deriving signals to control heat supplied by the second heater means to affect the temperature of the items exiting from the second heater means, the signals from the first control output and the second control output correlated by the control means so the items exiting from the second heater means are approximately in accordance with the predetermined temperature profile.

2. The heater as claimed in claim 1 wherein the first heater means and second heater means are located above the conveyor.

3. The heater as claimed in claim 1 wherein the first heater means and second heater means are located below the conveyor.

4. The heater as claimed in claim 1 wherein the first heater means and the second heater means both include a panel type heater located above the conveyor and a panel type heater located below the conveyor.

5. The heater as claimed in claim 4 wherein the panel type heater located above the conveyor provides a different temperature to the panel type heater located below the conveyor for both the first heater means and the second heater means.

6. The heater as claimed in claim 1 wherein the temperature sensing device is located above the conveyor.

7. The heater as claimed in claim 1 wherein the temperature sensing device is located below the conveyor.

8. The heater as claimed in claim 1 including a second temperature sensing device adjacent the conveyor and deriving signals indicative of the temperature of the items exiting from the second heater means, the control means having an input supplied by the signals from the second temperature sensing device and correlating the input supplied by the signals from first and second temperature sensing device.

9. The heater as claimed in claim 8 including a third heater means adjacent the conveyor and downstream of the second heater means for applying a third quantity of heat to the items, a third control output control from the control means deriving signals to control heat supplied by the third heater means to affect the temperature of the items exiting from the third heater means, the signals from the first control output, the second control output and the third control output correlated by the control means, so the items exiting from the third heater means are approximately in accordance with the predetermined temperature profile.

10. The heater as claimed in claim 9 wherein the input from the first temperature sensing device affects the second control output to the second heater means.

11. The heater as claimed in claim 9 wherein the input from the second temperature sensing device affects the second control output to the second heater means.

12. The heater as claimed in claim 9 wherein the input from the first temperature sensing device controls the first output to the first heater means and predicts the second output to the second heater means and the third output to the third heater means according to the predetermined temperature profile; and the input from the second temperature sensing device fine tunes and corrects the second output to the second heater means and the third output to the third heater means.

13. The heater as claimed in claim 9 wherein the input from the first temperature sensing device controls the first output to the first heater means, and a weighted average of the input from the first temperature sensing device and the input from the second temperature sensing device controls and predicts the second output to the second heater means and the third output to the third heater means according to the predetermined temperature profile.

14. A heater for use in heating items on a conveyor in a stabilized heat environment to follow a predetermined temperature profile, the heater comprising a plurality of heater means adjacent the conveyor for applying heat to the items, the heater means spaced along the conveyor, plurality of temperature sensing devices adjacent the conveyor and located downstream of each of the heater means, the temperature sensing devices deriving signals indicative of the temperature of the items but not the temperature of the heater means exiting from the heater means, control means for comparing signals indicative of the temperature of the items with the predetermined temperature profile, the control means having inputs from each of the temperature sensing device, and producing control outputs deriving signals to control heat supplied by the plurality of the heater means, so the items exiting from the heater are approximately in accordance with the predetermined temperature profile.

15. The heater according to claim 14 wherein the control outputs from the control means to each of the heater means are affected directly by the input from the temperature sensing devices immediately downstream of each of the heater means.

16. The heater according to claim 14 wherein the control outputs from the control means to each of the heater means are affected directly by the input from the temperature sensing devices immediately upstream and immediately downstream of each of the heater means where applicable.

17. The heater according to claim 14 wherein the control outputs from the control means to each of the heater means are affected directly by the input from the temperature sensing devices immediately upstream of each of the heater means.

18. A process for producing a predetermined temperature profile for a circuit board transported through at least two heat zones, comprising the steps of:
transporting a circuit board through a first heat zone followed by a second heat zone;
measuring temperature of the circuit board between the first heat zone, and the second heat zone;
comparing temperature of circuit board with the predetermined temperature profile, and;
controlling the temperature of the second heat zone so that the circuit board follows the predetermined temperature profile, and feed back controlling the temperature of the first heat zone for ensuring subsequent circuit boards follow the predetermined temperature profile.

19. The process according to claim 18 wherein the temperature of the circuit board leaving the second heat zone is measured, compared with the predetermined temperature profile, and together with the temperature of the circuit board between the first heat zone and second heat zone is used to control the temperature of the second heat zone so that the circuit board follows the predetermined temperature profile and feed back controlling temperature of the first heat zone for ensuring subsequent circuit boards follow the predetermined temperature profile.

20. The process according to claim 18 wherein the circuit board is transported through a plurality of heat zones, the temperature of the circuit board between heat zones is measured and compared with a predetermined temperature profile, and the temperature of the heat zones controlled individually so that subsequent circuit boards follow the predetermined temperature profile.

21. The process according to claim 18 wherein the circuit board is transported through a plurality of heat zones, the temperature of the circuit board leaving each of the heat zones is measured and compared with a predetermined temperature profile, and the temperature of the heat zones controlled individually so that subsequent circuit boards follow the predetermined temperature profile.

22. A heater for use in heating items on a conveyor to follow a predetermined temperature profile, the heater comprising first heater means adjacent the conveyor for applying a first quantity of heat to the items, second heater means adjacent the conveyor and downstream of the first heater means for applying a second quantity of heat to the items, third heater means adjacent the conveyor and downstream of the second heater means for applying a third quantity of heat to the items, at least one temperature sensing device adjacent the conveyor for deriving signals indicative of the temperature of the items but not the temperature of the heater means as they exit from at least one of the heater means, and control means for comparing signals indicative of the temperature of the items with the predetermined temperature profile, the control means having an input supplied by the signals from the temperature sensing device, a first control output from the control means deriving signals to control heat supplied by the first heater means to affect the temperature of the items exiting from the first heater means, a second control output from the control means deriving signals to control heat supplied by the second heater means to affect the temperature of the items exiting from the second heater means, a third control output from the control means deriving signals to control heat supplied by the third heater means to affect the temperature of the items exiting from the third heater means, the signals from the first control, output the second control output and the third control output correlated by the control means so the items exiting from the third heater means are approximately in accordance with the predetermined temperature profile.

23. The heater as claimed in claim 22 wherein the first heater means, second heater means and third heater means are located above the conveyor.

24. The heater as claimed in claim 22 wherein the first heater means, second heater means and third heater means are located below the conveyor.

25. The heater as claimed in claim 22 wherein the first heater means, the second heater means and the third heater means all include a panel type heater located above the conveyor and a panel type heater located below the conveyor.

26. The heater as claimed in claim 25 wherein the panel types, heater located above the conveyor provides a different temperature to the panel type heater located below the conveyor for both the first heater means, the second heater means and the third heater means.

27. The heater as claimed in claim 22 wherein the temperature sensing devices is located for deriving signals indicative of the temperature of the items as they exit from the third heater means.

28. The heater as claimed in claim 22 wherein a first temperature sensing device derives signals indicative of the temperature of the items as they exit from the first heater means, and a second temperature sensing device derives signals indicative of the temperature of the items as they exit from the second heater means; the control means having an input supplied by the signals from the first and second temperature sensing devices.

29. The heater as claimed in claim 28 including a third temperature sensing devices adjacent the conveyor and deriving signals indicative of the temperature of the items exiting from the third heater means, the control means having an input supplied by the signals from the third temperature sensing devices, and correlating the input supplied by the signals from first, second and third temperature sensing means to control the first, second and third output for the first, second and third heater means.

30. The heater as claimed in claim 29 including at least one further heater means adjacent the conveyor and downstream of the third heater means for applying a further quantity of heat to the items, a further control output control from the control means deriving signals to control heat supplied by the further heater means to affect the temperature of the items exiting from the further heater means, the signals from all the control outputs, correlated by the control means, so the items exiting from the further heater means are approximately in accordance with the predetermined temperature profile.

31. The heater as claimed in claim 28 wherein the input from the first temperature sensing device above affects the second control output to the second heater means.

32. The heater as claimed in claim 28 wherein the input from the second temperature sensing affects the second output to the second heater means.

33. The heater as claimed in claim 28 wherein the input from the first temperature sensing device controls the first output to the first heater means and predicts the second output to the second heater means and the third output to the third heater means according to the predetermined temperature profile; and the input from the second temperature sensing device fine tunes and corrects the second output to the second heater means and the third output to the third heater means.

34. The heater as claimed in claim 28 wherein the input from the first temperature sensing device controls the first output to the first heater means, and a weighted average of the input from the first temperature sensing device and the input from the second temperature sensing device controls and predicts the second output to the second heater means and the third output to the third heater means according to the predetermined temperature profile.

35. A heater for use in heating items on a conveyor in a stabilized heat environment to follow a predetermined temperature profile, the heater comprising at least threeheater means adjacent the conveyor for applying heat to the items, the heater means spaced along the conveyor, at least one temperature sensing device adjacent the conveyor and located downstream of at least one of the heater means, the temperature sensing device deriving signals indicative of the temperature of the items but not the temperature of the heater means exiting from the heater means, control means for comparing signals indicative of the temperature of the items with the predetermined temperature profile, the control means having inputs from the temperature sensing means, and producing control outputs deriving signals to control heat supplied by the three heater means, so the items exiting from the heater are approximately in accordance with the predetermined temperature profile.

36. The heater according to claim 35 wherein the control outputs from the control means to each of the heater means are affected directly by the input from the temperature sensing device located immediately downstream of at least one of the heater means.

37. The heater according to claim 35 wherein the control outputs from the control means to each of the heater means are affected directly by the input from temperature sensing devices located immediately upstream and immediately downstream of each of the heater means where applicable.

38. The heater according to claim 35 wherein the control outputs from the control means to each of the heater means are affected directly by the input from the temperature sensing device located immediately upstream of at least one of the heater means.

39. A heater for use in heating items on a conveyor to follow a predetermined temperature profile, the heater comprising a first heater means adjacent the conveyor for applying a first quantity of heat to the items, second heater means adjacent the conveyor and downstream of the first heater means for applying a second quantity of heat to the items, at least one temperature sensing device adjacent the conveyor for deriving signals indicative of the temperature of the items but not the temperature of the heater means as they exit from at least one of the heater means, and control means for comparing signals indicative of the temperature of the items with the predetermined temperature profile, the control means having an input supplied by the signals from the temperature sensing device, a first control output from the first control means deriving signals to control heat supplied by the first heater means to affect the temperature of the items exiting from the first heater means, a second control output from the control means deriving signals to control heat supplied by the second heater means to affect the temperature of the items exiting from the second heater means, the signals from the first control output and the second control output correlated by the control means so the items exiting from the second heater means are approximately in accordance with the predetermined temperature profile.

40. The heater as claimed in claim 39 wherein the temperature sensing device is located for deriving signals indicative of the temperature of the items as they exit from the second heater means.

41. A process for producing a predetermined temperature profile for a circuit board transported through at least three heat zones, comprising the steps of:

transporting a circuit board through a first heat zone followed by a second heat zone followed by a third heat zone;

measuring temperature of the circuit board immediately after it leaves at least one of the heat zones;

comparing the temperature of the circuit board with the predetermined temperature profile, and;

controlling the tmperature of the first heat zone, the second heat zone and third heat zone so that the circuit board follows the predetermined temperature profile.

42. The process according claim 41 wherein the temperature of the circuit board is measured immediately after it leaves the third heat zone.

43. A process for producing a predetermined temperature profile for a circuit board transported through at least three heat zones, comprising the steps of:

transporting a circuit board through a first heat zone followed by a second heat zone followed by a third heat zone;

measuring temperature of the circuit board between the first heat zone and the second heat zone;

measuring temperature of the circuit board between the second heat zone and the third heat zone;

comparing temperatures of the circuit board with the predetermined temperature profile; and controlling the temperature of the second heat zone and third heat zone so that the circuit board follows the predetermined temperature profile, and feed back controlling the temperature of the first heat zone for ensuring subsequent circuit boards follow the predetermined temperature profile.

44. The process according to claim 43 wherein the temperature of the circuit board leaving the third heat zone is measure, compared with the predetermined temperature profile, and together with the temperature of the circuit board between the first heat zone and second heat zone and the temperature of the circuit baord between the second heat zone and the third heat zone, are used to control the temperatures of the second heat zone and the third heat zone so that the circuit board follows the predetermined temperature profile and feed back controlling temperature of the first heat zone for ensuring subsequent circuit boards follow the predetermined temperature profile.

45. The process according to claim 43 wherein the circuit board is transported through a plurality of heat zones, the temperature of the circuit board between heat zones is measured and compared with a predetermined temperature profile, and the temperature of the heat zones controlled individually so that subsequent circuit boards follow the predetermined temperature profile.

46. The process according to claim 43 wherein the circuit board is transported through a plurality of heat zones, the temperature of the circuit baord leaving each of the heat zones is measured and compared with a predetermined temperature profile, and the temperature of the heat zones controlled individually so that subsequent circuit boards follow the predetermined temperature profile.

47. A process for producing a predetermined temperature profile for a circuit board transported through at least two heat zones, comprising the steps of:

transporting a circuit baord through a first heat zone followed by a second heat zone;

measuring temperature of the circuit board immediately after it leaves at least one of the heat zones;

comparing the temperature of the circuit board with the predetermined temperature profile, and controlling the temperature of the first heat zone and the second heat zone so that the circuit board follows the predetermined temperature profile.

48. The process according to claim 47 wherein the temperature of the circuit boards is measured immediately after it leaves the second heat zone.

* * * * *